(12) United States Patent
Li

(10) Patent No.: US 12,638,334 B2
(45) Date of Patent: May 26, 2026

(54) BLACK SILICON CARBIDE CERAMIC BASED THERMOELECTRIC PHOTODETECTOR, OPTICAL POWER METER AND OPTICAL ENERGY METER

(71) Applicant: SHANDONG XINYUAN PHOTOELECTRIC TECHNOLOGY CO., LTD, Linyi (CN)

(72) Inventor: Delong Li, Linyi (CN)

(73) Assignee: SHANDONG XINYUAN PHOTOELECTRIC TECHNOLOGY CO., LTD, Linyi (CN)

(*) Notice: Subject to any disclaimer, the term of this patent is extended or adjusted under 35 U.S.C. 154(b) by 859 days.

(21) Appl. No.: 17/822,778

(22) Filed: Aug. 27, 2022

(65) Prior Publication Data

US 2022/0412806 A1 Dec. 29, 2022

Related U.S. Application Data

(63) Continuation of application No. PCT/CN2021/078269, filed on Feb. 26, 2021.

(30) Foreign Application Priority Data

| Feb. 28, 2020 | (CN) | .......................... | 202010130728.1 |
| Apr. 30, 2020 | (CN) | .......................... | 202010366053.0 |
| Apr. 30, 2020 | (CN) | .......................... | 202020708298.2 |

(51) Int. Cl.
*G01J 5/12* (2006.01)
*H10N 10/01* (2023.01)
*H10N 10/17* (2023.01)

(52) U.S. Cl.
CPC ................ *G01J 5/12* (2013.01); *H10N 10/01* (2023.02); *H10N 10/17* (2023.02)

(58) Field of Classification Search
None
See application file for complete search history.

(56) References Cited

U.S. PATENT DOCUMENTS

2019/0305159 A1* 10/2019 Santangelo ............. H01L 21/74
2019/0393673 A1* 12/2019 Cao .................... G01N 15/1404

FOREIGN PATENT DOCUMENTS

CN 209541901 U * 10/2019

OTHER PUBLICATIONS

Sung-Jae Joo, Min-Seok Kang, Wook Bahng, Sang-Mo Koo, Black SiC formation induced by Si overlayer deposition and subsequent plasma etching, Thin Solid Films, vol. 519, Issue 11, (Year: 2011).*

* cited by examiner

*Primary Examiner* — Erica S Lin
(74) *Attorney, Agent, or Firm* — George Guosheng Wang; Upstream Research and Patent LLC

(57) ABSTRACT

A black silicon carbide ceramic based thermoelectric photodetector, and a thermoelectric optical power meter/thermoelectric optical energy meter using same. The black silicon carbide ceramic based thermoelectric photodetector comprises a thermal conduction plate (21) made of a black silicon carbide ceramic, wherein the surface of one side of the thermal conduction plate (21) is an optical absorption surface (211); and a thermopile (22) or a series connection conductive metal layer (302) is arranged on the surface of either side of the thermal conduction plate (21) to constitute the thermoelectric photodetector. In the thermoelectric photodetector, the black silicon carbide ceramic is used as both the thermal conduction plate (21) and a light absorber, and is directly combined with the thermopile (22) or the series connection conductive metal layer (302) to constitute the (Continued)

thermoelectric photodetector, thereby simplifying the structure of the thermoelectric photodetector.

12 Claims, 8 Drawing Sheets

Thermoelectric optical detector ......... Voltmeter

BLACK SILICON CARBIDE CERAMIC BASED THERMOELECTRIC PHOTODETECTOR, OPTICAL POWER METER AND OPTICAL ENERGY METER

TECHNICAL FIELD

The present invention relates to a thermoelectric photo-detector, in particular to a black silicon carbide ceramic based thermoelectric photodetector, and meanwhile relates to a thermoelectric optical power meter/thermoelectric optical energy meter adopting the same.

BACKGROUND

In the prior art, structures of thermoelectric laser detectors (such as laser detectors used in thermoelectric optical power meters or thermoelectric optical energy meters manufactured by Ophir Optronics, Coherent, Gentec-EO, Laser point and other manufacturers) are shown in FIG. 1. They commonly adopt an aluminum alloy substrate as a thermal conductive plate 100, one side of the thermal conductive plate 100 is provided with a deep-color optical absorption coating 101 so as to achieve high-rate absorption of an optical incident surface, the other side of the thermal conductive plate 100 is firstly provided with an insulating layer 102 (or an insulated oxide layer is directly generated on a surface of an aluminum alloy), then, a thermoelectric pile 103 is arranged on a surface of the insulating layer 102 (namely, a plurality of thermocouples are connected in series and attached to the surface of the insulating layer 102) so as to detect a temperature difference generated during heat conduction, and then incident light power or optical pulse energy is measured.

However, the existing thermoelectric laser detectors have many defects and are short in service life, high in fault rate and poor in durability, and consequently, users need to frequently conduct replacement and maintenance. Specifically, the existing thermoelectric laser detectors have following several problems: 1, the deep-color optical absorption coating 101 arranged on the surface of the optical incident surface of the aluminum alloy substrate is extremely prone to being damaged by superlaser, which causes reduction of optical absorptivity, and once the surface of the aluminum alloy substrate serving as the thermal conductive plate 100 is exposed, the aluminum alloy substrate will have high optical reflectivity, thereby causing inaccuracy of the laser detectors; 2, the surface of the deep-color optical absorption coating 101 is likely to be stained by people and hard to clean, which causes changes of the optical absorptivity and inaccuracy of the laser detectors; 3, since the thermal conductive plate 100, the deep-color optical absorption coating 101 and the insulating layer 102 are different in material, a coefficient of thermal expansion of the aluminum alloy substrate is high, the thermal conductive plate 100 is not matched with the insulating layer 102 in material, and therefore the thermoelectric pile 103 is likely to fall off from the thermal conductive plate 100 due to heat expansion and cold shrinkage of the insulating layer 102 on a back surface in a usage process, and consequently, the laser detectors break down; and 4, the aluminum alloy substrate with a melting point being 500° C.-660° C. does not resist high temperature, a high temperature limit of the common laser detectors based on the aluminum alloy substrate does not exceed 300° C., and therefore, the laser detectors cannot bear optical measurement with high average power.

In the above problems, damage of the deep-color optical absorption coating 101 is a main reason for failures and faults of a large number of thermoelectric laser detectors, and the thermoelectric laser detectors with the faults can only be replaced and cannot be replaced, which makes usage cost high.

SUMMARY

The present disclosure aims to solve a primary technical problem about providing a black silicon carbide ceramic based thermoelectric photodetector for light power measurement and optical pulse energy measurement.

The present disclosure aims to solve the other technical problem about providing a thermoelectric optical power meter/thermoelectric optical energy meter adopting the thermoelectric photodetector.

In order to achieve the objective, the present disclosure adopts the following technical solutions.

according to a first aspect of the embodiment of the present disclosure, a thermoelectric photodetector is provided and includes a thermal conductive plate made from black silicon carbide ceramics and integrally serving as a light absorber; a surface of one side of the thermal conductive plate is an optical absorption surface; and a thermoelectric pile is arranged on any side surface of the thermal conductive plate, where preferably, the thermoelectric pile forms a closed curve around an optical incident area, or, the thermoelectric pile and heat insulation edges jointly form a closed curve around the optical incident area; and according to a second aspect of the embodiment of the present disclosure, a thermoelectric photodetector is provided, includes a thermal conductive plate made from black silicon carbide ceramics, and further includes a series conductive metal layer and a heat dissipation ceramic plate; the thermal conductive plate integrally serves as a light absorber; a surface of one side of the thermal conductive plate is an optical absorption surface, the series conductive metal layer is arranged on a surface of the other side of the thermal conductive plate, and the heat dissipation ceramic plate is arranged on surfaces of the sides, away from the thermal conductive plate, of the series conductive metal layer, where preferably, the series conductive metal layer includes a thermocouple group formed by a plurality of thermocouples connected in series, the thermocouple group includes a plurality of semiconductor groups and a plurality of copper electrode slices, each semiconductor group includes an N-type semiconductor and a P-type semiconductor, the plurality of semiconductor groups are sequentially connected in series through the plurality of copper electrode slices, and the copper electrode slices at a front end and a rear end form a positive electrode and a negative electrode;

preferably, a surface of the side, away from the series conductive metal layer, of the heat dissipation ceramic plate is metalized; and preferably, a radiator is arranged on a surface of the side, away from the series conductive metal layer, of the heat dissipation ceramic plate.

In the above two thermoelectric photodetectors, the black silicon carbide ceramics are formed by sintering black silicon carbide powder.

Preferably, the black silicon carbide ceramics are formed by sintering the black silicon carbide powder through any one of processes such as pressureless sintering, high-heat isostatic pressing sintering, hot pressed sintering, recrystallization, reactive sintering and chemical vapor deposition. Higher density and higher heat conducting performance can be caused by a sintering environment with high pressure.

Preferably, the density of the black silicon carbide ceramics is 2.6-3.2 $g/cm^3$, and generally speaking, the higher the density, the better the heat conducting performance becomes.

Preferably, an optical absorption surface of the black silicon carbide ceramics is not a mirror surface.

Preferably, the surface roughness Ra of the optical absorption surface of the black silicon carbide ceramics is 0.8-6.3 microns.

Preferably, a laser damage threshold of the black silicon carbide ceramics is larger than 3 $GW/cm^2$ under narrow pulse and high peak power and is at least 200-500 $J/cm^2$ under broad pulse and high energy.

According to a third aspect of the embodiment of the present disclosure, a thermoelectric optical power meter/ thermoelectric optical energy meter adopting the thermoelectric photodetector is provided.

The black silicon carbide ceramic based thermoelectric photodetector and provided by the present disclosure includes a thermal conductive plate made from black silicon carbide ceramics. The thermal conductive plate integrally serves as a light absorber, and one side of the thermal conductive plate is an optical absorption surface. In the thermoelectric photodetector of the structure provided by the present disclosure, a thermoelectric pile is arranged on any side surface (the optical absorption surface or a surface opposite to the optical absorption surface) of the thermal conductive plate to constitute the thermoelectric photodetector. In the thermoelectric photodetector of the other structure provided by the present disclosure, a series conductive metal layer and a heat dissipation ceramic plate are arranged on a back surface of a thermal conductive plate to constitute the thermoelectric photodetector.

In the above thermoelectric photodetector, the black silicon carbide ceramics are used as the thermal conductive plate and the light absorber at the same time and replace a three-layer structure (including an aluminum alloy substrate, a deep-color optical absorption coating and an insulating layer) in an existing thermoelectric photodetector to enable the black silicon carbide ceramics to be directly combined with a thermoelectric pile or the series conductive metal layer to constitute the thermoelectric photodetector, and the structure of the thermoelectric photodetector is simplified. Meanwhile, since the black silicon carbide ceramics are high in heat conductivity coefficient, low in coefficient of thermal expansion, resistant to high temperature and high in laser damage threshold, and the optical absorption surface can be cleaned in a lapping manner, a fault rate of the thermoelectric photodetector is reduced, and service life of the thermoelectric photodetector is greatly prolonged.

DETAILED DESCRIPTION

The following further describes the technical solutions of the present disclosure with reference to the accompanying drawings and specific embodiments.

Figure 2:
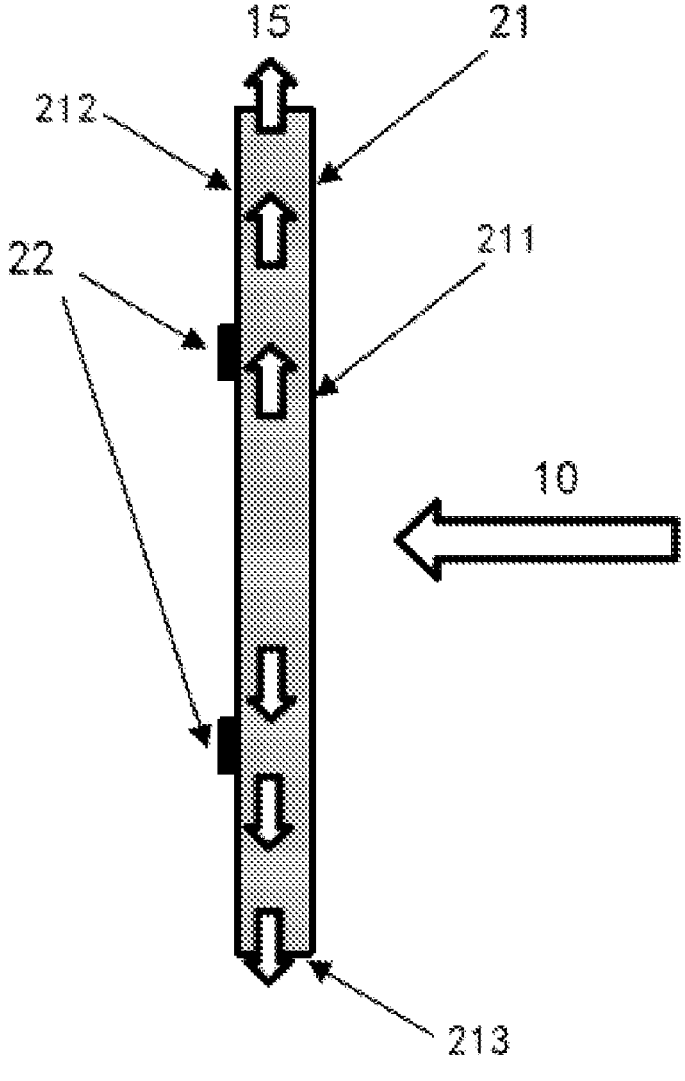
FIG. 2 is a structural schematic diagram of a thermoelectric photodetector with black silicon carbide ceramics as a thermal conductive plate in the present disclosure.

As shown in FIG. 2, a black silicon carbide ceramic based thermoelectric photodetector (photodetector also known as optical detector, the same below) provided in this embodiment of the present disclosure includes a thermal conductive plate 21 made from the black silicon carbide ceramics and integrally serving as a light absorber, a surface of one side, towards incident light 10, of the thermal conductive plate 21 (a surface with a large area) is an optical absorption surface 211, and meanwhile a thermoelectric pile 22 is arranged on any side surface of the thermal conductive plate 21 to form the thermoelectric photodetector. The thermoelectric pile 22 may be arranged on the optical absorption surface 211 of the thermal conductive plate 21 and may also be arranged on the other side surface 212 (a surface opposite to the optical absorption surface 211, namely a back surface 212) of the thermal conductive plate 21. Preferably, the thermoelectric pile 22 is arranged on the back surface 212 of the thermal conductive plate 21 so as to be prevented from being polluted. Heat 15 absorbed by the thermoelectric photodetector in a detection process passes through the thermoelectric pile 22 and then is outwards diffused from a side surface 213 of the thermal conductive plate 21, and heat dissipation is commonly performed by a radiator making contact with the thermal conductive plate 21.

Figure 3:
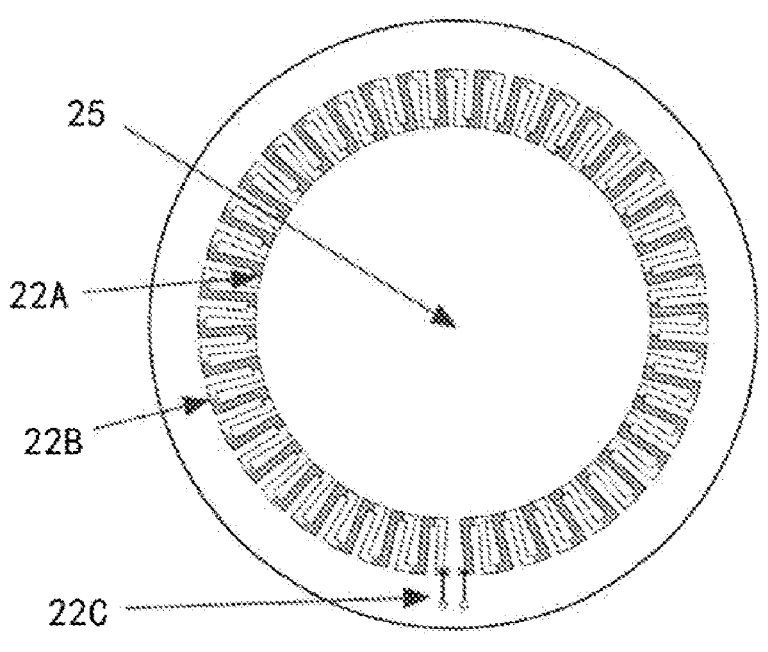
FIG. 3 is a structural schematic diagram for arranging a thermoelectric pile on a surface of the thermal conductive plate.

As shown in FIG. 3, the thermoelectric pile 22 is formed by connecting a plurality of thermocouples in series and has a series of bimetal knots (each including a hot end 22A and a cold end 22B), and a voltage is formed between every two adjacent knots due to a temperature difference therebetween. The plurality of knots are connected in series, the hot ends 22A are constantly arranged on the interior hot side, the cold ends 22B are arranged on the exterior cold side, and therefore radial heat flux of the thermoelectric pile 22 makes an output end 22C of the thermoelectric pile 22 generate a voltage proportionable to power input. The incident light 10 irradiates to an optical incident area 25 (namely a center of an area defined by the thermoelectric pile 22 in a closed curve shape), and heat absorbed by the thermal conductive plate 21 flows in a radial direction and is diffused from an area on an outer side of the thermoelectric pile 22.

Figure 1:
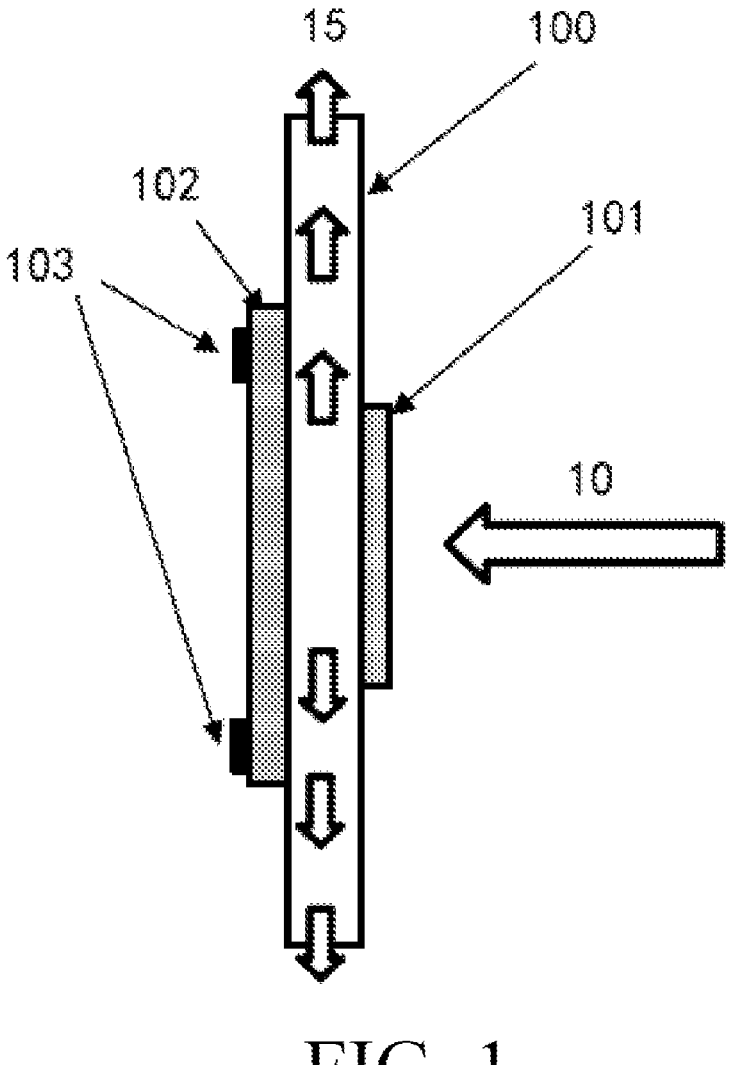
FIG. 1 is a structural schematic diagram of a thermoelectric photodetector with an aluminum alloy substrate as a thermal conductive plate in the prior art.

As shown in FIG. 2, the thermoelectric photodetector provided in this embodiment of the present disclosure uses a monolayer material (specifically, an integrated structure of the light absorber and the thermal conductive plate made from the black silicon carbide ceramics) to replace a three-layer structure of a conventional thermoelectric photodetector (specifically including an aluminum alloy substrate 100, a deep-color optical absorption coating 101 and an insulating layer 102 shown in FIG. 1). The black silicon carbide ceramics are used for making the thermal conductive plate 21 and the light absorber at the same time to basically solve the problem that in the existing three-layer structure, the aluminum alloy substrate 100 with high optical reflectivity is exposed after the deep-color optical absorption coating 101 is damaged, and consequently, a detection result is prone to being inaccurate. In addition, due to omission of the insulating layer, the problem of thermoelectric pile disengaging caused by unmatched coefficients of thermal expansion of the thermal conductive plate and the insulating layer is solved.

The black silicon carbide ceramics used in the above structure are formed by black silicon carbide powder through a sintering process. Specifically, the black silicon carbide ceramics are formed by sintering the black silicon carbide powder through any one of technologies such as pressureless sintering, high-heat isostatic pressing sintering, hot pressed sintering, recrystallization, reactive sintering and chemical vapor deposition. Preferably, higher density and higher heat conducting performance can be caused by a sintering environment with high pressure. It needs to be explained that the technical solution provided in this embodiment of the present disclosure aims for protecting the thermoelectric photodetector made from the black silicon carbide ceramics serving as the thermal conductive plate and the light absorber but not for the black silicon carbide ceramic sintering process or the black silicon carbide ceramics. Thus, regardless of improving the existing sintering process to obtain denser or more uniform black silicon carbide ceramics, using the same for manufacturing the thermoelectric photodetector provided in this embodiment of the present disclosure belongs to a scope of protection claimed by the present disclosure.

The black silicon carbide ceramics are formed by sintering the black silicon carbide powder. At present, there are many preparation methods to synthesize the black silicon carbide powder, such as an Acheson synthesis method, a laser method and an organic precursor method. The Acheson synthesis method is most commonly used in industry, and the black silicon carbide powder is prepared by adding quartz sand and coke into a furnace body and adding a proper amount of saw dust serving as an additive. Since the furnace body of a reacting furnace is large in volume, temperature distribution in the furnace body is uneven to a certain degree, and accordingly the synthesized silicon carbide powder may have a certain difference in performance. In addition, the quartz sand and the coke serving as reacting raw materials are not pure enough and may contain some iron and aluminum metal impurities. Thus, impurities may exist in the obtained silicon carbide powder. The absolutely-pure silicon carbide powder is colorless in most cases while silicon carbide doped with a small number of metal impurities is green, and when the content of the metal impurities is increased, the silicon carbide powder will be deeper in color so as to be black. The black silicon carbide is higher than the green silicon carbide in tenacity and is mainly used for machining ceramics, refractory materials and nonferrous metals. The silicon carbide ceramics formed by sintering the black silicon carbide powder are also black and thus are referred to as the black silicon carbide ceramics. The black silicon carbide ceramics formed by sintering the silicon carbide powder with the dark color are selected in this embodiment of the present disclosure to serve as the thermal conductive plate 21 and the light absorber of the thermoelectric photodetector at the same time. It needs to be explained that the black silicon carbide ceramics mentioned in this embodiment of the present disclosure aim to be distinguished from the green silicon carbide ceramics with the light color, and the silicon carbide ceramics may include but not limited to dark blue silicon carbide ceramics, dark gray silicon carbide ceramics and charcoal gray silicon carbide ceramics with the dark colors, thereby guaranteeing high light absorptivity but not limiting that the adopted silicon carbide ceramics needs to be black.

An inventor carries out intensive study and considers that a pure silicon carbide material is suitable for serving as a semiconductor due to certain conductivity and poor insulativity, and thus not suitable for serving as a connection matrix of the thermoelectric pile and accordingly not suitable for being used in the thermoelectric photodetector provided in this embodiment of the present disclosure. Moreover, a common silicon carbide material is insufficient in density and thermal conductivity and thus is not suitable for manufacturing the thermal conductive plate 21 and the light absorber of the thermoelectric photodetector. The silicon carbide ceramics are poor in electrical conductivity and suitable for serving as a matrix of the thermoelectric pile and meanwhile has high density and thermal conductivity to be suitable for serving as the thermal conductive plate 21 and the light absorber of the thermoelectric photodetector.

On the other hand, in the silicon carbide material, the pure green silicon carbide is not suitable for optical absorption due to the color, is poor in optical absorptivity and has high optical reflectivity. The optical absorptivity of the black silicon carbide is obviously higher than that of the green silicon carbide, and the optical reflectivity of the black silicon carbide is lower than that of the green silicon carbide. Thus, the black silicon carbide ceramics serving as spectral and optical absorbing materials are more suitable for serving as the thermal conductive plate 21 and the light absorber of the thermoelectric photodetector.

All in all, compared with the pure silicon carbide material and the green silicon carbide ceramics, the black silicon carbide ceramics are high in impurity content, have higher specific resistance, thermal conductivity and light absorptivity, are lower than the pure silicon carbide material and the green silicon carbide ceramics in surface reflectivity and thus are more suitable for manufacturing the thermoelectric photodetector.

In an embodiment of the present disclosure, the black silicon carbide ceramics are used as the thermal conductive plate 21, on one hand, the black serving as an optical absorption medium has irreplaceable advantages, and on the other hand, the optical absorption surface 211 of the black silicon carbide ceramics is not a mirror surface and has certain surface roughness after being machined, for example, good optical absorption can be guaranteed by controlling Ra between 0.8 micron and 6.3 microns. When the surface of the light absorber made from the black silicon carbide ceramics is cleaned, granularity of adopted diamond lapping paste needs to be matched with the surface roughness. Using the diamond lapping paste with certain granularity for cleaning the optical absorption surface of the thermal conductive plate 21 can repair the surface roughness of the optical absorption surface and facilitate optical absorption. When a surface of the optical incident area 25 of the optical absorption surface 211 of the black silicon carbide ceramics is machined or cleaned, surface roughness of a detection area (namely, the optical incident area 25) should be kept consistent so as to ensure uniformity of optical absorption.

It needs to be emphasized that when the black silicon carbide ceramics are adopted for making the thermal conductive plate 21 and the light absorber, the content of the impurities should guarantee that resistance of the black silicon carbide ceramics is far higher than that of the thermoelectric pile 22 (R black silicon carbide ceramics>>R thermoelectric pile), and accordingly, interference on the thermoelectric pile 22 is reduced to the minimum from electrical conductivity of the black silicon carbide ceramics while low electrical conductivity of existing black silicon carbide ceramic materials can meet the requirement. Thus, the thermoelectric pile 22 can be directly attached to the back surface of the black silicon carbide ceramics 21 without the additional insulating layer.

The density of pure silicon carbide crystals is 3.16-3.2 $g/cm^3$, and the density of the black silicon carbide ceramics obtained through the sintering process is 2.6-3.2 $g/cm^3$. Preferably, the density of the dense black silicon carbide ceramics can reach 98% or above of the theoretical density of the silicon carbide ceramics. Generally speaking, the higher the density of the black silicon carbide ceramics, the better the heat conducting performance becomes, and the black silicon carbide ceramics are more suitable for making the thermoelectric photodetector. Through the intensive study, the black silicon carbide ceramics meeting the requirement of the embodiment of the present disclosure simultaneously conform to following characters: the black silicon carbide ceramics are black bodies, can absorb lasers without coatings and have consistent and good optical absorption characters both on the surface and in the interior; the black silicon carbide ceramics are good in insulativity and low in conductivity and can directly make physical contact with the thermoelectric pile 22 without causing short circuit or electrical interference; the black silicon carbide ceramics have good heat conducting performance and can rapidly dissipate heat so as to avoid scorch caused by high-power lasers; the black silicon carbide ceramics have a low coefficient of thermal expansion and thus is not prone to thermal expansion and cracking by tight combination with the thermoelectric pile, and accordingly, the thermoelectric pile is prevented from falling off; and in addition, the black silicon carbide ceramics have a high laser damage threshold (see below specifically) and can resist high temperature without smelting, and thus, the black silicon carbide ceramics are suitable for making the thermoelectric photodetector provided in this embodiment of the present disclosure. In addition, the black silicon carbide ceramics have reasonable density and specific heat capacity and can guarantee that the thermoelectric photodetector has enough response speed.

Chart 1 is a comparison table of relevant parameters of common black silicon carbide ceramics and a common aluminum alloy. It can be known from comparison that the black silicon carbide ceramics have similar characters with the aluminum alloy in heat conductivity coefficient, density, specific heat capacity and the like; and meanwhile, compared with the aluminum alloy, the black silicon carbide ceramics have obvious application advantages in work temperature, coefficient of thermal expansion, light reflectivity and specific resistance. Thus, the inventor thinks that compared with the aluminum alloy, the black silicon carbide ceramics have more advantages in serving as the thermal conductive plate and the light absorber of the laser detector.

Chart 1 Comparison chart of relevant parameters of black silicon carbide ceramics and common aluminum alloy:

| Material | Unit | Black silicon carbide ceramics (Surface roughness Ra = 0.8 microns) | Aluminum alloy |
|---|---|---|---|
| Heat conductivity coefficient | W/(m · K) | 120-170 | 150-230 |
| Density | $g/cm^3$ | About 2.6-3.2 | About 2.7-2.8 |
| Specific heat capacity | J/(kg · K) | 600-1000 | 750-1000 |
| Work temperature | ° C. | >1000 | <500 |
| Coefficient of thermal expansion | $\times 10^{-6} K^{-1}$ | 4.1 | 18.8-23.6 |
| Light reflectivity (wavelength 240-2600 nm) | — | 10%-30%, strong absorption | 70-90%, high reflectivity |
| Specific resistance | $\Omega \cdot m$ | Low electrical conductivity, about $1\text{-}50 \times 10^{-4}$ | High electrical conductivity, about $2.9 \times 10^{-8}$ |

Experimental measurement and theoretical calculation performed on the laser damage threshold of the black silicon carbide ceramics by the inventor are introduced in detail as below.

The pressureless sintered black silicon carbide ceramics are selected for preparing the thermoelectric photodetector, the ceramic density is 3.15 $g/cm^3$, the content of silicon carbide is about 98%, the optical absorptivity for the wavelength being 635 nm is about 80%, the heat conductivity coefficient is about 150 W/(m·K), the ceramic thickness is 2 mm, surface roughness Ra=0.8 microns, and experiments are performed as below.

A first experiment is a short-pulse and high-peak-power test. Pulsed lasers with a wavelength being 1064 nm, a pulse width being 500 ps and single pulse energy being 200 mJ are selected as a test light source to perform impact irradiation on a surface of a black silicon carbide ceramic sample under circular light spots different in diameter. When the diameters of the light spots are 2 mm and 3 mm, the surfaces of the silicon carbide ceramics are slightly damaged, and when the diameters of the light spots are 4 mm and 5 mm, the surfaces of the silicon carbide ceramics are not obviously damaged except slight white spots in color. The laser damage threshold is judged to be 3.2 $GW/cm^2$-5.6 $GW/cm^2$ on the basis. An aluminum alloy detector with an optical absorption coating can bear a laser damage threshold commonly within 30 $MW/cm^2$, for example, the damage threshold of an Ophir Optronics laser detector is about 3 $MW/cm^2$, and the laser damage threshold of a Laser point laser detector is about 30 $MW/cm^2$. It can be said that the laser damage threshold of the black silicon carbide ceramics is increased by 100 times or above.

After the above experiment is finished, 600-mesh diamond lapping paste is used for manually lapping a surface of a black silicon carbide ceramic wafer subjected to impact irradiation, color spots at light spots being 4 mm and 5 mm can be easily removed, slight surface layer damage still exists at light spots being 3 mm, and certain-depth damage exists at light spots being 2 mm. Judgment on the laser damage threshold by people is further confirmed. In addition, it indicates that a simple lapping process can be used for cleaning and recovering the surfaces, stained by intense lasers, of the black silicon carbide ceramics, thereby improving reusability and long-term usage economic efficiency of the laser detector. In a conventional thermoelectric photodetector, a coating arranged on a surface of an aluminum alloy substrate cannot be cleaned and restored once stained, and the whole laser detector needs to be repaired and replaced.

A second experiment is a broad-pulse and high-energy test: at a room temperature being 20° C., in a 2 ms broad pulse state, an 808 nm semiconductor laser of 200 J is used for irradiating the surfaces of the black silicon carbide ceramics with a thickness being 2 mm in a 10 mm×10 mm light spot area, a highest local temperature of an irradiated area is measured to be about 300° C., but no material damage happens. It shows that an energy damage threshold is larger than 200 J/cm² in the broad pulse state. According to theoretical calculation, if 10 mm×10 mm×2 mm silicon carbide ceramics are used, assuming that the density of the silicon carbide ceramics is 3.15 g/cm³, the specific heat capacity is 800 J/(kg·K) and the optical absorptivity is 85%, under the situation of temperature rise being 900° C. (the silicon carbide still has no material damage at the time), the silicon carbide ceramics theoretically can receive optical pulse energy E=900×(800/1000)×(1×1×0.2×3.15)/85%=534 J. The laser energy density at the time reaches 534 J/cm². Namely, the theoretical laser damage threshold is larger than 500 J/cm2. An aluminum alloy substrate with an optical absorption coating can bear a laser damage threshold commonly within 50 J/cm², for example, the damage threshold of the Ophir Optronics laser detector is about 10 J/cm², and the damage threshold of the Laser point laser detector is about 36 J/cm². It can be thought that the damage threshold of the silicon carbide ceramics is increased by about 10 times in the situations of broad pulse and high energy through comparison.

Thus, the black silicon carbide ceramics are used as the thermal conductive plate and the light absorber of the thermoelectric photodetector so as to greatly improve the optical damage threshold of the laser detector, then prolong service life and improve durability, and are extremely suitable for detecting ultrahigh-power light or pulse energy.

A structure of the thermoelectric photodetector provided in an embodiment of the present disclosure is schematically introduced in combination with FIG. 2-FIG. 4h below. The following embodiment is merely used for explaining the structure of the thermoelectric photodetector but not form specific structure limitation.

As shown in FIG. 2 and FIG. 3, a black silicon carbide ceramic based thermoelectric photodetector provided in this embodiment of the present disclosure includes a thermal conductive plate 21 made from the black silicon carbide ceramics and integrally serving as a light absorber; a surface of one side of the thermal conductive plate 21 is an optical absorption surface 211; and a thermoelectric pile 22 is arranged on any side surface of the thermal conductive plate 21 to constitute the thermoelectric photodetector. The thermoelectric pile 22 may be arranged on the optical absorption surface 211 of the thermal conductive plate 21 and may also be arranged on the other side surface 212 (a surface opposite to the optical absorption surface 211, namely a back surface) of the thermal conductive plate 21. Preferably, the thermoelectric pile 22 is arranged on the back surface 212 of the thermal conductive plate 21 so as to be prevented from being polluted.

In an embodiment of the present disclosure, the thermoelectric pile 22 is arranged on an outer side of an optical incident area 25 of the thermal conductive plate 21, and an outer side of the thermoelectric pile 22 is a heat dissipation area 24 (see areas marked with c in FIG. 4a-FIG. 4h); and heat absorbed by the optical incident area 25 is diffused towards the outer side through the thermoelectric pile 21 (a diffusion direction of the heat in the optical incident area 25 is marked through black arrows in FIG. 4a-FIG. 4h). Hot ends 22A of the thermoelectric pile 22 are arranged on an inner side of an area with the thermoelectric pile 22 (one side close to the optical incident area 25), cold ends 22B of the thermoelectric pile 22 are arranged on an outer side of the area with the thermoelectric pile 22 (one side close to the heat dissipation area 24), and two ends of the thermoelectric pile 22 are conducted out to form output ends 22C. The thermoelectric pile 22 is formed by connecting a plurality of knots in series so as to increase an output voltage thereof, and the output voltage is in direct proportion to a temperature difference generated after the heat flows through the hot ends 22A and the cold ends 22B of the thermoelectric pile 22; and power and energy of incident light can be detected by detecting the output voltage.

When a heat insulation edge 23 is arranged on the thermal conductive plate 21, the thermoelectric pile 22 and the heat insulation edge 23 define a closed shape, where the heat insulation edge 23 is used for resisting the heat absorbed in the optical incident area 25 from being outwards diffused from a position of the heat insulation edge 23, which can be achieved by enabling the thermal conductive plate 21 at the position not to make contact with the radiator, and accordingly, all the heat flows through the thermoelectric pile 22. When no heat insulation edge is arranged on the thermal conductive plate 21, the thermoelectric pile 22 defines a closed shape so as to guarantee that all the heat flows through the thermoelectric pile 22. Since all the heat absorbed by the thermal conductive plate 21 flows through the thermoelectric pile 22 (as long as the incident light 10 irradiates into inner circles of the hot knots 22A), response of the thermoelectric photodetector is nearly irrelevant to a size and a position of an incident light beam. If the light beam is close to the edges of the inner circles, some thermocouples are hotter than the other thermocouples, but since the sum of all the thermocouples is measured, read numbers are kept unchangeable.

Specifically, as shown in FIG. 4a-FIG. 4h, the thermal conductive plate 21 is not limited to be circular or rectangular or regularly polygonal, may also be in other unshown shapes and may also be in regular figures or other irregular figures; the thermoelectric pile 22 forms a closed curve around the optical incident area 25, or the thermoelectric pile 22 and the heat insulation edge 23 define the closed curve; and a topological graph of the closed curve defined by the thermoelectric pile 22 (or the thermoelectric pile 22 and the heat insulation edge 23) arranged on the thermal conductive plate 21 does not certainly correspond to the thermal conductive plate 21 in shape. A set position of the thermoelectric pile 22 is not limited to a center position of the thermal conductive plate 21; and when some side edges of the thermal conductive plate 21 are set as heat insulation edges 23, the set position of the thermoelectric pile 22 may be close to the edges or corners.

Figure 4A:
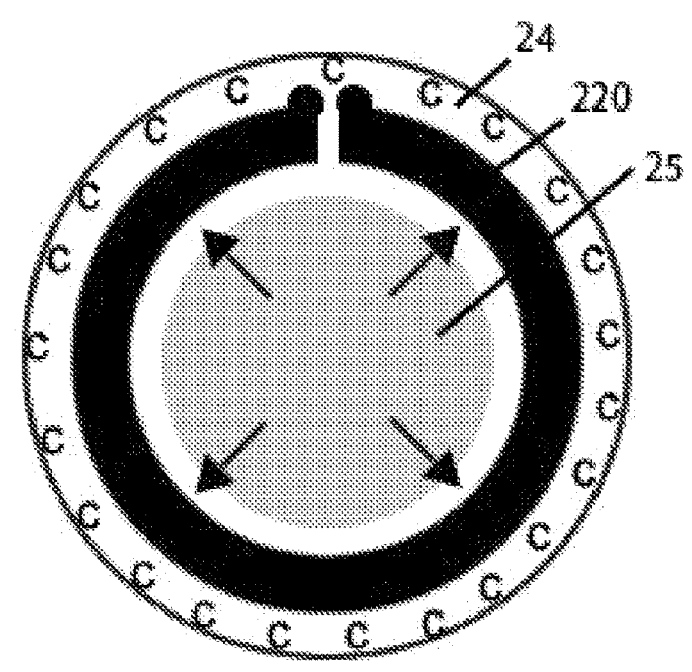
FIG. 4a-FIG. 4h are structural schematic diagrams of multiple thermoelectric photodetectors provided in embodiments of the present disclosure.

In the embodiment shown in FIG. 4a, a thermal conductive plate 21 is circular, a thermoelectric pile 22 is an annular thermoelectric pile 220 formed by connecting a plurality of thermocouples in series, and the annular thermoelectric pile 220 is distributed around the center of the thermal conductive plate 21 to form the closed curve. As shown in FIG. 4*a*, a gray area represents an optical incident area 25, an annular thermoelectric pile 220 is arranged around the optical incident area 25 to form a circle, symbols c represent heat dissipation areas 24 on an outer side of the annular thermoelectric pile 220, black arrows represent heat diffusion directions in the optical incident area 25, and heat absorbed in the optical incident area 25 is outwards diffused through the annular thermoelectric pile 220.

Figure 4B:
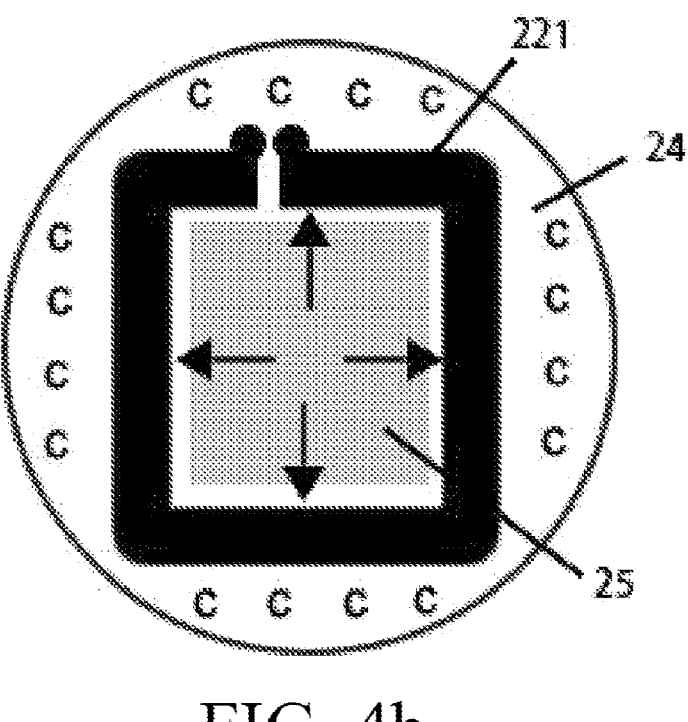

In the embodiment shown in FIG. 4*b*, a thermal conductive plate 21 is circular, a thermoelectric pile 22 is a square thermoelectric pile 221 formed by connecting a plurality of thermocouples in series, and the square thermoelectric pile 221 is distributed around the center of the thermal conductive plate 21 to form a closed curve. As shown in FIG. 4*b*, a gray area represents an optical incident area 25 defined by the square thermoelectric pile 221, which is arranged around the optical incident area 25 to form a square, symbols c represent heat dissipation areas 24 on an outer side of the square thermoelectric pile 221, black arrows represent heat diffusion directions in the optical incident area 25, and heat absorbed in the optical incident area 25 is outwards diffused through the square thermoelectric pile 221.

Figure 4C:
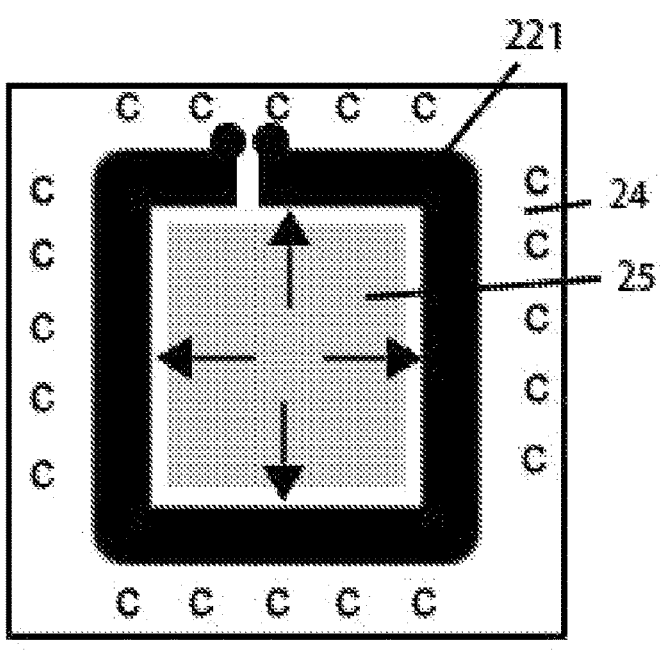

In the embodiment shown in FIG. 4*c*, a thermal conductive plate 21 is square, a thermoelectric pile 22 is a square thermoelectric pile 221 formed by connecting a plurality of thermocouples in series, and the square thermoelectric pile 221 is distributed around the center of the thermal conductive plate 21 to form a closed curve. As shown in FIG. 4*c*, a gray area represents an optical incident area 25 defined by the square thermoelectric pile 221, the square thermoelectric pile 221 is arranged around the optical incident area 25 to form a square, symbols c represent heat dissipation areas 24 on an outer side of the square thermoelectric pile 221, black arrows represent heat diffusion directions in the optical incident area 25, and heat absorbed in the optical incident area 25 is outwards diffused through the square thermoelectric pile 221.

Figure 4D:
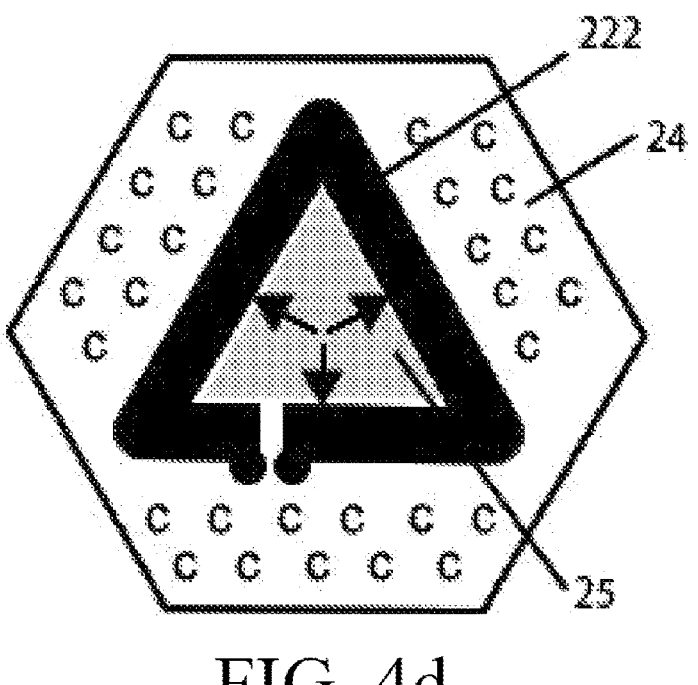

In the embodiment shown in FIG. 4*d*, a thermal conductive plate 21 is hexagonal, a thermoelectric pile 22 is a triangular thermoelectric pile 222 formed by connecting a plurality of thermocouples in series, and the triangular thermoelectric pile 222 is distributed around the center of the thermal conductive plate 21 to form a closed curve. As shown in FIG. 4*b*, a gray area represents an optical incident area 25 defined by the triangular thermoelectric pile 222, the triangular thermoelectric pile 222 is arranged around the optical incident area 25 to form a triangle, symbols c represent heat dissipation areas 24 on an outer side of the triangular thermoelectric pile 222, black arrows represent heat diffusion directions in the optical incident area 25, and heat absorbed in the optical incident area 25 is outwards diffused through the triangular thermoelectric pile 222.

In the embodiments shown in FIG. 4*e*-FIG. 4*h*, a thermal conductive plate 21 is rectangular, a heat insulation edge 23 is arranged on one or two side edges of the thermal conductive plate 21, a thermoelectric pile 22 is arranged in an area, not defined by the heat insulation edge 23, on a periphery of an optical incident area 25, and the heat insulation edge 23 and the thermoelectric pile 22 jointly define a closed curve. The heat insulation edge 23 is/are close to the side edges or corners, thus, a closed area defined by the thermoelectric pile 22 and the heat insulation edge 23 is close to the side edges or corners as well, and heat absorbed from the optical incident area 25 is outwards diffused only in a direction where the thermoelectric pile 22 is located.

Figure 4E:
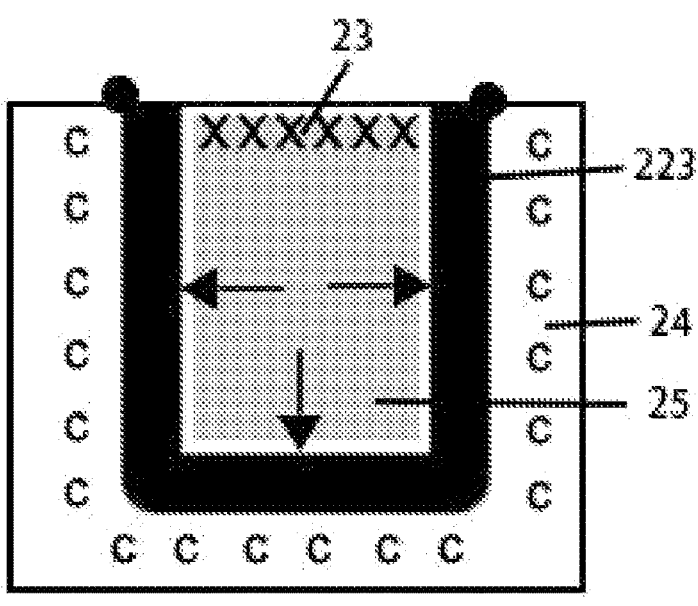

In FIG. 4*e*, the heat insulation edge 23 is arranged on an upper side edge of the thermal conductive plate 21 and occupies a middle part of the upper side edge; a U-shaped thermoelectric pile 223 and the heat insulation edge 23 define a square closed shape internally being an optical incident area 25, and heat absorbed in the optical incident area 25 is diffused towards a heat dissipation area 24 located on an outer side of the U-shaped thermoelectric pile 223 from the U-shaped thermoelectric pile 223 arranged on a left side, a lower side and a right side.

Figure 4F:
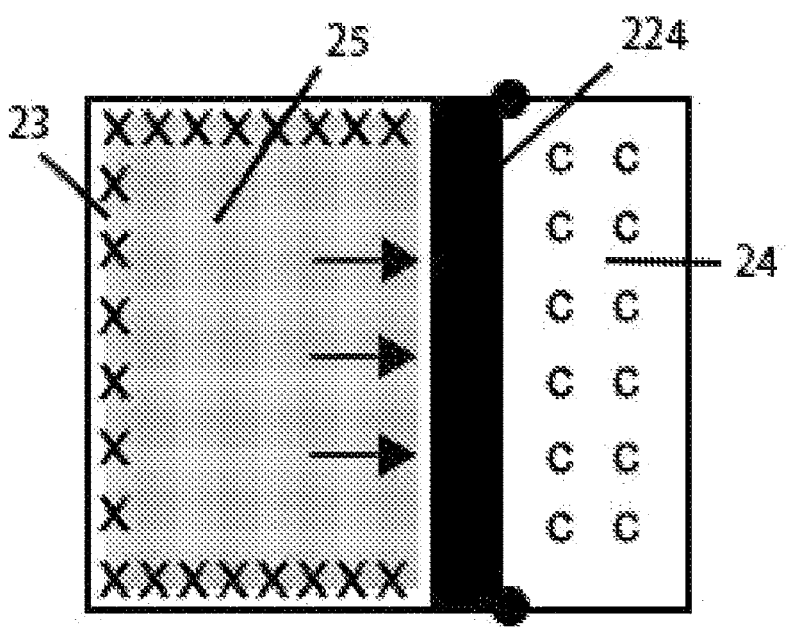

In FIG. 4*f*, the heat insulation edges 23 are arranged on a left side edge, an upper side edge and a lower side edge of the thermal conductive plate 21 at the same time and occupy left half parts of the upper side edge and the lower side edge; a linear thermoelectric pile 224 is arranged at a position, close to a right side, in the thermal conductive plate 21 so as to divide the thermal conductive plate 21 into an optical incident area 25 located on a left side and a heat dissipation area 24 located on the right side; and heat absorbed in the optical incident area 25 is diffused towards the right-side heat dissipation area 24 from the linear thermoelectric pile 224.

Figure 4G:
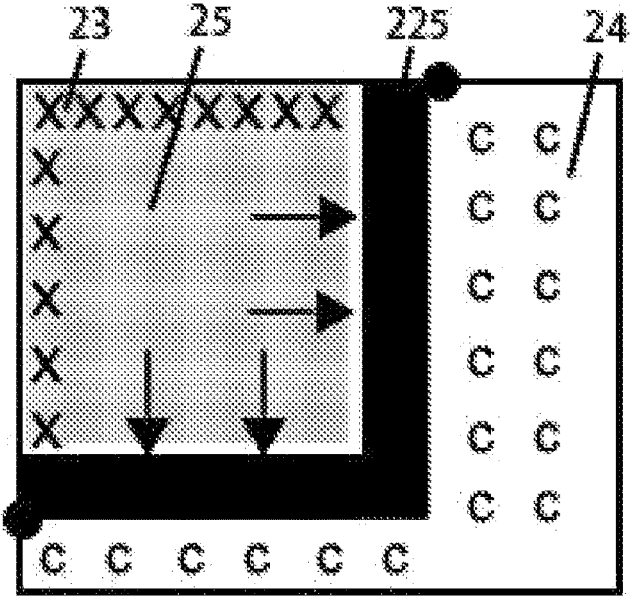

In FIG. 4*g*, the heat insulation edges 23 are arranged on a left side edge and an upper side edge of the thermal conductive plate 21 at the same time and occupy a left side part of the left side edge and an upper half part of the upper side edge; and a broken-line-shaped thermoelectric pile 225 and the heat insulation edges 23 define a square closed shape internally being an optical incident area 25, the optical incident area 25 is close to an upper left corner of the thermal conductive plate 21, and heat absorbed in the optical incident area 25 is diffused towards a heat dissipation area 24 on an outer side (specifically, a lower side and a right side of the broken-line-shaped thermoelectric pile 225) from the broken-line-shaped thermoelectric pile 225.

Figures 4H, 5:
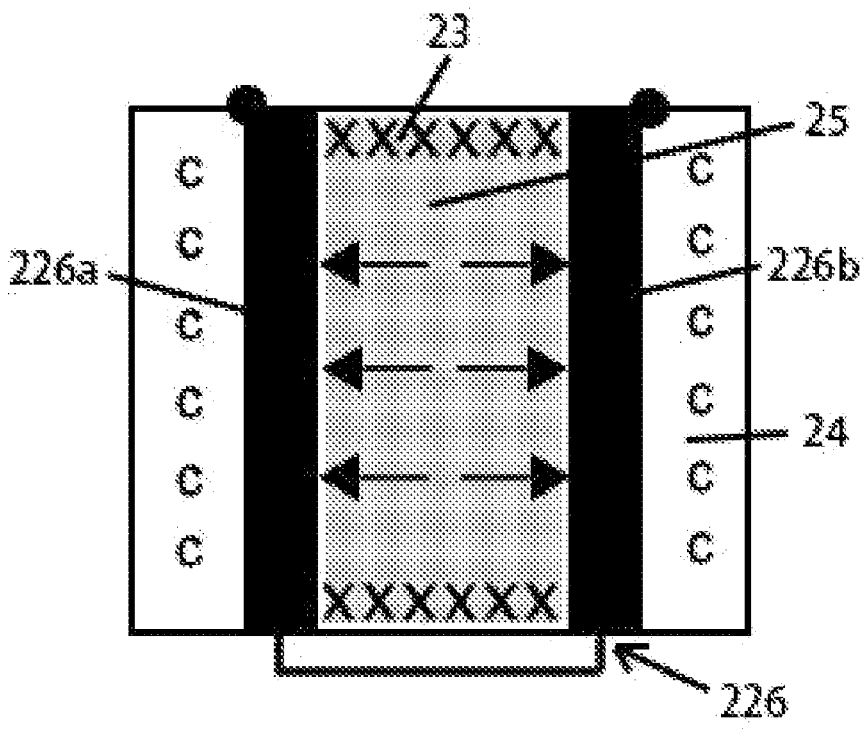
FIG. 5 is a structural schematic diagram of a thermoelectric optical power meter/thermoelectric optical energy meter provided in an embodiment of the present disclosure.

In FIG. 4*h*, the heat insulation edges 23 are arranged at middle parts of an upper side edge and a lower side edge of the thermal conductive plate 21 at the same time; a thermoelectric pile 226 includes two linear thermoelectric piles 226*a* and 226*b*, the left thermoelectric pile 226*a* and the right thermoelectric pile 226*b* are arranged on two sides of the heat insulation edges 23 correspondingly, one end of the left thermoelectric pile 226*a* and one end of the right thermoelectric pile 226*b* (lower ends shown in the drawing) are connected into a whole through a wire, and the other end of the left thermoelectric pile 226*a* and the other end of the right thermoelectric pile 226*b* (upper ends shown in the drawing) are led out to serve as output ends 22C. In the embodiment, a left area of the left thermoelectric pile 226*a* and a right area of the right thermoelectric pile 226*b* are heat dissipation areas 24, and accordingly, heat absorbed in an optical incident area 25 is diffused towards the heat dissipation areas 24 on the two sides of the thermal conductive plate 21 through the left thermoelectric pile 226*a* and the right thermoelectric pile 226*b* correspondingly.

Combinations of different thermocouples of bismuth-silver, nickel chromium-nickel silicon, copper-constantan, platinum-rhodium and the like can be selected for the thermoelectric pile 22 arranged on the surfaces of the black silicon carbide ceramics 21 according to application temperature, measurement precision, usage environment and other different applications.

Furthermore, as shown in FIG. 5, the present disclosure further provides a thermoelectric optical power meter (or a thermoelectric optical energy meter). The thermoelectric optical power meter/thermoelectric optical energy meter mainly includes the thermoelectric photodetector and a voltmeter 8 and may include other known kits. An output end 22C of the thermoelectric photodetector is connected to the voltmeter 8. The voltmeter 8 is used for measuring a voltage value, in preset proportion to actual power of a to-be-measured laser, output by the thermoelectric photodetector. The voltmeter 8 can be achieved by a digital multimeter, the digital multimeter can directly display the voltage value, in preset proportion to the actual power of the to-be-measured laser, output by the thermoelectric photodetector, and the actual power of the to-be-measured laser can be reversely deduced according to the voltage value in preset proportion to the actual power of the to-be-measured laser.

For example, when incident light 10 belongs to a laser acting for a long time, heat generated by the incident light 10 can enable a temperature difference detected by a thermoelectric pile 22 arranged on a surface of a thermal conductive plate 21 to be kept stable within a long time, correspondingly, a curve of an output voltage of the thermoelectric pile is kept at a certain peak value within a long time, and the thermoelectric photodetector can acquire light power of the incident light 10 by measuring a constant voltage generated by the thermoelectric pile 22 within a period of time. When the incident light 10 belongs to light pulse acting for a short time, heat generated by the light pulse can cause the temperature difference detected by the thermoelectric pile 22 arranged on the surface of the thermal conductive plate 21 to be changed within a short time, correspondingly, the curve of the output voltage of the thermoelectric pile 22 is changed within a short time, and through integration on the voltage output by the thermoelectric pile 22 within a short time, energy of the light pulse can be obtained and then can be measured.

It needs to be explained that optical signals measured by the optical detector/light power meter/light energy meter in the present disclosure center on the laser and may include others of optical signals such as ultraviolet, infrared and X-ray and even other fluorescence light emitted by a weak light source, etc.

A structure of the other thermoelectric photodetector provided by the present disclosure is described in combination with FIG. 6 below.

Figure 6:
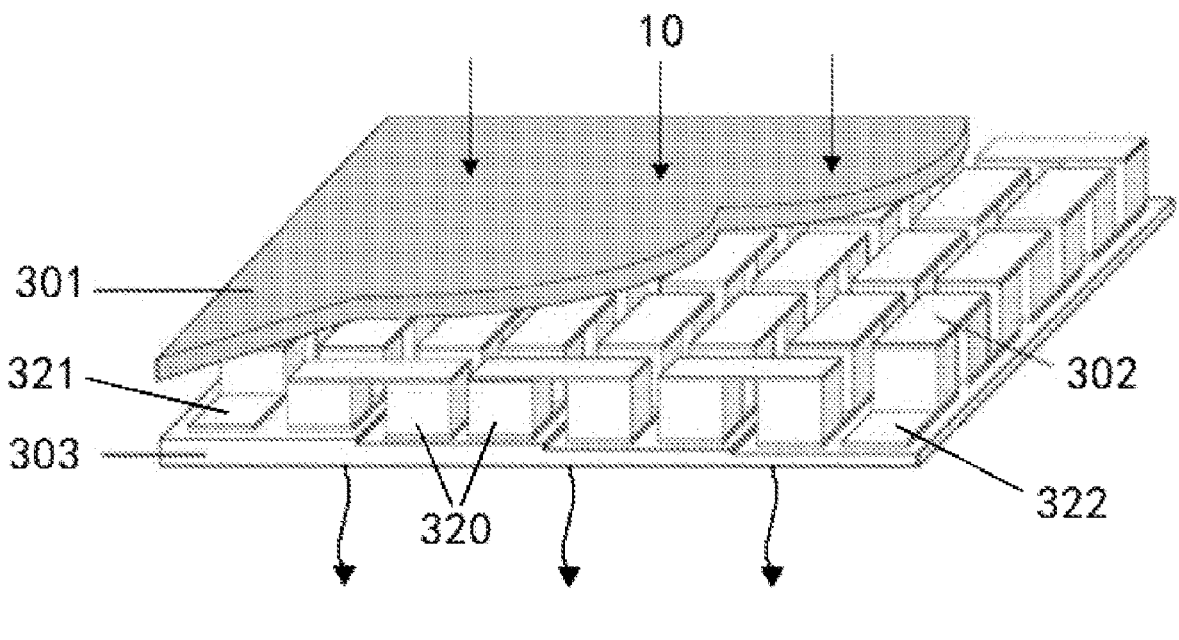
FIG. 6 is a structural schematic diagram of the other thermoelectric photodetector with black silicon carbide ceramics as a thermal conductive plate in the present disclosure.

Referring to FIG. 6, the thermoelectric photodetector provided in this embodiment of the present disclosure includes a thermal conductive plate 301 made from black silicon carbide ceramics and further includes a series conductive metal layer 302 and a heat dissipation ceramic plate 303. The thermal conductive plate 301 integrally serves as a light absorber; and a surface on one side of the thermal conductive plate 301 is an optical absorption surface (an upper surface shown in FIG. 6), the incident light 10 irradiates to the surface, and the thermal conductive plate 301 absorbs heat. The series conductive metal layer 302 is arranged on a surface (a lower surface shown in FIG. 6) of the other side of the thermal conductive plate 301, and a surface on the side, away from the thermal conductive plate 301, of the series conductive metal layer 302 is provided with the heat dissipation ceramic plate 303. The thermal conductive plate 301, the series conductive metal layer 302 and the heat dissipation ceramic plate 303 constitute a three-layer structure.

As shown in FIG. 6, the thermal conductive plate 301 is made from the black silicon carbide ceramics, the black silicon carbide ceramics serve as the thermal conductive plate and the light absorber at the same time and replace a three-layer structure (including an aluminum alloy substrate, a deep-color optical absorption coating and an insulating layer) in an existing thermoelectric photodetector to enable the black silicon carbide ceramics to be directly combined with the series conductive metal layer to constitute the thermoelectric photodetector of a vertical structure, and the structure of the thermoelectric photodetector is simplified. Meanwhile, since the black silicon carbide ceramics are high in heat conductivity coefficient, low in coefficient of thermal expansion, resistant to high temperature and high in laser damage threshold, and the optical absorption surface can be cleaned in a lapping manner, a fault rate of the thermoelectric photodetector is reduced, and service life of the thermoelectric photodetector is greatly prolonged. A preparation process of the black silicon carbide ceramics and beneficial effects brought by it are described in detail above and not repeated herein.

The series conductive metal layer 302 includes a thermocouple group formed by a plurality of thermocouples 320 connected in series, a first end 321 of the thermocouple group is a positive electrode, and a second end 322 of the thermocouple group is a negative electrode. The thermocouple group includes a plurality of semiconductor groups and a plurality of copper electrode slices. Each semiconductor group includes an N-type semiconductor and a P-type semiconductor, the plurality of semiconductor groups are sequentially connected in series through the plurality of copper electrode slices, and the copper electrode slices at a front end and a rear end form the positive electrode and the negative electrode. In the embodiment, the thermocouple group uses paired universal thermocouple materials such as pure copper-constantan and nickel chromium-nickel silicon or P-type and N-type bismuth telluride semiconductor thermocouple materials.

The heat dissipation ceramic plate 303 may select aluminum oxide, aluminum nitride, silicon carbide, silicon nitride and other various insulating and heat conducting ceramics and may also select black silicon carbide ceramics. A heat conduction effect of the heat between the thermal conductive plate 301 and the heat dissipation ceramic plate 303 is guaranteed by utilizing ceramic materials with good thermal conductivity. Accordingly, a light-heat-electricity integrated conversion effect is achieved.

A radiator is arranged on a surface of the side, away from the series conductive metal layer 302, of the heat dissipation ceramic plate 303 and used for dissipating heat. Preferably, the surface of the side, away from the series conductive metal layer 302, of the heat dissipation ceramic plate 303 is metalized so as to be welded to an exterior radiator for heat dissipation.

A heat dissipation member (not illustrated) is arranged on the side, away from the series conductive metal layer 302, of the heat dissipation ceramic plate 303 and used for absorbing the heat conducted to the heat dissipation ceramic plate 303 from the thermal conductive plate 301 so that the heat dissipation ceramic plate 303 can be rapidly cooled.

During specific usage, the thermal conductive plate 301 of the thermoelectric photodetector absorbs and converts the incident light 10 into heat and then conducts the heat to the series conductive metal layer 302 to be dissipated by the heat dissipation ceramic plate 303; and in the heat conducting process, induced voltage (namely output voltage) is generated at two ends of the series conductive metal layer 302 through a seebeck effect. After stable heat conduction is achieved, the induced voltage of the series conductive metal layer 302 is approximately in direct proportion to incident light power.

Compared with a conventional plane diffuse thermoelectric photodetector, the thermoelectric photodetector of the vertical structure has shorter response time and can bear higher incident light power. Heat conduction capability of the thermoelectric photodetector can be greatly improved by adopting the high-heat-conducting thermocouples and increasing an area ratio of a thermocouple section to silicon carbide ceramics on an incident surface, and then the incident light power is improved. The thermoelectric photodetector with characters of high power and rapid response are particularly suitable for real-time power measurement and fluctuated monitoring of current kilowatt-level, myriawatt-level and even higher-power fiber lasers. For example, the thermoelectric photodetector adopting semiconductor thermocouple materials with a high ZT value (Thermoelectric figure of merit) can serve as an excellent photoelectric converter for solar power generation and other occasions.

The present disclosure further provides a preparation method of the thermoelectric photodetector shown in FIG. 6, including following steps:

S1, an optical incident surface of black silicon carbide ceramics is ground and polished to meet the requirement for roughness;

S2, a surface of the side, back onto the optical incident surface, of the black silicon carbide ceramics is sputtered, electroplated and etched to form a thermocouple bonding pad on a first side and a series connection line;

S3, a surface of one side of a heat dissipation ceramic plate is sputtered, electroplated and etched to form a thermocouple bonding pad on a second side and a corresponding series connection line;

S4, two matched thermocouples are machined into highly same particles;

S5, surfaces of the thermocouples on the two sides are coated with solder, and the black silicon carbide ceramics, heat dissipation ceramic wafers and the thermocouples are assembled and arranged in order to be stably arranged on a heating plate;

S6, the heating plate is used for performing heating reflux welding on the ceramics, the solder and the thermocouple group which are assembled and arranged; and S7, a lead is welded to two output ends of the thermocouple group in a spot-welding manner. Specifically, in step S1, the optical incident surface of the black silicon carbide ceramics is ground and polished to achieve the uniform roughness Ra suggested to be about 0.8 (avoiding mirror surface polishing), so as to guarantee optical absorption uniformity.

Step S2 includes following substeps:

S21: magnetron sputtering electroplating of Ti—Cu or Cr—Cu is performed on a weld surface (namely the surface of the side back onto the optical incident surface) of the black silicon carbide ceramics, where a Ti layer or a Cr layer is used for enhancing bonding force of a metal layer, and an integral magnetron sputtering thickness is commonly less than or equal to 2 microns;

S22: the sputtered black silicon carbide ceramics are subjected to wet electroplating of Cu, a copper layer is thickened to 10-50 microns, and then a layer of gold can be selected to be arranged on the surface through electroplating (the thickness is commonly less than or equal to 1 micron) so as to facilitate later welding; and S23: a mask is manufactured, the metal layer of the black silicon carbide ceramics subjected to wet electroplating is etched to form the thermocouple bonding pad on one side (namely the first side) and the series connection line.

In step S3, the surface of one side of the heat dissipation ceramic plate can be sputtered, electroplated and etched through the method the same in steps S21-S23 to form the bonding pad on the other side (namely the second side) and the corresponding series connection line.

The heat dissipation ceramic plate may select aluminum oxide, aluminum nitride, silicon carbide, silicon nitride and other various insulating and heat conducting ceramics. For example, the heat dissipation ceramic plate may select aluminum oxide ceramics and may also adopt a Direct Copper Bonding (DBC) process to directly prepare the bonding pads and the lines.

In addition, the other side of the heat dissipation ceramic plate may be metalized so as to support welding heat dissipation with the radiator.

In step S4, the two matched thermocouples are machined into the highly same particles (a cube, a cuboid, a cylinder and other different shapes can be adopted). Acid pickling or other cleaning processes are performed according to different materials so as to remove surface stain and an oxide layer, thereby guaranteeing cleaning of an upper weld surface and a lower weld surface.

In step S5, welding paste coating, or solder evaporation or welding sheet applying is performed between the bonding pads and the lines on the ceramic wafers on the two sides, and certain liquid soldering flux may be applied to assemble and arrange the upper-lower ceramics (including the black silicon carbide ceramics and the heat dissipation ceramic plate) and the thermocouples in order to be stably arranged on the heating plate.

For example, a gold-tin welding sheet is adopted, such as Au80/Sn20 or Au85/Sn15, gold electroplating treatment on the bonding pads on the surface of the ceramics is recommended, and accordingly after gold-tin solder and a gold electroplated layer are fused, a proportion of a gold component in the solder is increased, thereby increasing a re-melting point.

In step S6, the heating plate is used for performing heating reflux welding on the ceramics, the solder and the thermocouples which are assembled and arranged. Different temperature curves and atmosphere environments, such as nitrogen or vacuum environment, may be set according to different solders. In the welding process, applying a certain pressure to the ceramics can improve welding quality and reliability.

In step S7, the lead is welded to the two output ends of the thermocouple group in the spot-welding manner.

Finally, the welded thermoelectric photodetector is cleaned and may be immersed and flushed by trichloro ethylene or methenyl chloride so as to remove the remaining soldering flux or other organic stains generated during welding.

If there is a dampproof requirement for the thermocouples, silica gel, epoxy resin and other materials can be used for edge sealing treatment on a gap between two pieces of ceramics (the black silicon carbide ceramics and the thermal conductive ceramic plate) so as to insulate water vapor after step S7 is finished.

In conclusion, the thermoelectric photodetector provided in this embodiment of the present disclosure adopts the thermal conductive plate made from the black silicon carbide ceramics as the light absorber so that laser absorptivity cannot be influenced even the surface of the light absorber is damaged. The present disclosure solves the problem that in the existing thermoelectric photodetector, once a metal heat conducting matrix is exposed to the irradiating laser, intense optical reflection will be generated, and consequently, the detector loses accuracy. Meanwhile, since the black silicon carbide ceramics have insulativity, disengaging of the thermoelectric pile or the series conductive metal layer due to thermal expansion of the thermal conductive plate can be avoided by directly arranging the thermoelectric pile or the series conductive metal layer on the surface of the light absorber, in addition, the thermoelectric pile or the series conductive metal layer makes direct contact with the thermal conductive plate more reliably, heat conduction is more rapid, and response is more sensitive.

The black silicon carbide ceramics have advantages that a heat conductivity coefficient is high, a coefficient of thermal expansion is low, high temperature resistance is achieved, a laser damage threshold is high, and an optical absorption surface can be cleaned in a lapping manner so that heat can be rapidly dissipated, disengaging of the thermoelectric pile due to thermal expansion of the thermal conductive plate can be avoided, damage to the optical absorption surface of the thermal conductive plate can be reduced, a fault rate of the thermoelectric photodetector is reduced, and service life of the thermoelectric photodetector is greatly prolonged. In the usage process, even when slightly damaged, the optical absorption surface of the black silicon carbide ceramics can be cleaned in a simple manner, such as grinding through diamond lapping paste, and then light spot traces on the surfaces of the black silicon carbide ceramics can be easily cleaned away. The thermoelectric photodetector provided in this embodiment of the present disclosure is simple in structure, low in cost, reliable in performance, long in life and particularly suitable for power measurement of the laser or other light sources or energy measurement of the light pulse and has huge economic value.

The black silicon carbide ceramic based thermoelectric photodetector is explained in detail above. Any obvious modification made by a person of ordinary skill in the art to the present disclosure without departing from the essence of the present disclosure will constitute an infringement of the patent right of the present disclosure, and a person of ordinary skill who make such modification shall bear corresponding legal liabilities.

What is claimed is:

1. A thermoelectric photodetector, comprising a thermal conductive plate made from black silicon carbide ceramics, wherein
    the thermal conductive plate integrally serves as a light absorber;
    one side surface of the thermal conductive plate is an optical absorption surface;
    the thermoelectric photodetector further comprises a thermoelectric pile arranged directly on the optical absorption surface or the other side surface; and
    a surface roughness (Ra) of the optical absorption surface of the black silicon carbide ceramics is 0.8-6.3 microns.

2. The thermoelectric photodetector according to claim 1, wherein the thermoelectric pile forms a closed curve around an optical incident area.

3. The thermoelectric photodetector according to claim 1, further comprising a series-connected metal layer and a heat dissipation ceramic plate, wherein a surface of one side of the thermal conductive plate is an optical absorption surface, the series-connected metal layer is arranged on a surface of the other side of the thermal conductive plate, and the heat dissipation ceramic plate is arranged on a surface of the side, away from the thermal conductive plate, of the series-connected metal layer.

4. The thermoelectric photodetector according to claim 3, wherein
    the series-connected metal layer comprises a thermocouple group formed by a plurality of thermocouples connected in series, the thermocouple group comprises a plurality of semiconductor groups and a plurality of copper electrode slices, each semiconductor group comprises an N-type semiconductor and a P-type semiconductor, the plurality of semiconductor groups are sequentially connected in series through the plurality of copper electrode slices, and the copper electrode slices at a front end and a rear end form a positive electrode and a negative electrode.

5. The thermoelectric photodetector according to claim 4, wherein
    a surface of the side, away from the series-connected metal layer, of the heat dissipation ceramic plate is metalized.

6. The thermoelectric photodetector according to claim 4, wherein
    a radiator is arranged on a surface of the side, away from the series-connected metal layer, of the heat dissipation ceramic plate.

7. The thermoelectric photodetector according to claim 1, wherein
    the optical absorption surface is cleaned in a lapping manner.

8. The thermoelectric photodetector according to claim 1, wherein
    a density of the black silicon carbide ceramics is 2.6-3.2 $g/cm^3$.

9. The thermoelectric photodetector according to claim 1, wherein the optical absorption surface of the black silicon carbide ceramics is not a mirror surface.

10. The thermoelectric photodetector according to claim 1, wherein
    the black silicon carbide ceramics comprise but are not limited to dark blue, dark gray and charcoal gray silicon carbide ceramics with dark colors.

11. A thermoelectric optical power meter, comprising a voltmeter and the thermoelectric photodetector according to claim 1, wherein the voltmeter is connected to an output end of the thermoelectric photodetector.

12. A thermoelectric optical energy meter, comprising a voltmeter and the thermoelectric photodetector according to claim 1, wherein the voltmeter is connected to an output end of the thermoelectric photodetector.

* * * * *